(12) United States Patent
Shi

(10) Patent No.: US 9,490,802 B2
(45) Date of Patent: Nov. 8, 2016

(54) APPARATUS AND METHOD FOR TRANSMITTING AN ANALOG SIGNAL, AND ANALOG SIGNAL MULTIPLEXER

(71) Applicant: ABB Schweiz AG, Baden (CH)

(72) Inventor: Huan Shi, Hangzhou (CN)

(73) Assignee: ABB TECHNOLOGY LTD., Zurich (CH)

( * ) Notice: Subject to any disclaimer, the term of this patent is extended or adjusted under 35 U.S.C. 154(b) by 0 days.

(21) Appl. No.: 14/434,958

(22) PCT Filed: Oct. 23, 2012

(86) PCT No.: PCT/CN2012/083375
§ 371 (c)(1),
(2) Date: Apr. 10, 2015

(87) PCT Pub. No.: WO2014/063306
PCT Pub. Date: May 1, 2014

(65) Prior Publication Data
US 2015/0288360 A1 Oct. 8, 2015

(51) Int. Cl.
*H03K 17/14* (2006.01)
*H03K 17/795* (2006.01)
*H04B 10/80* (2013.01)
*H03K 17/00* (2006.01)

(52) U.S. Cl.
CPC ........ *H03K 17/7955* (2013.01); *H03K 17/002* (2013.01); *H03K 17/14* (2013.01); *H04B 10/802* (2013.01)

(58) Field of Classification Search
CPC ............ H01S 3/06791; G02B 6/0018; G02B 6/0028
See application file for complete search history.

(56) References Cited

U.S. PATENT DOCUMENTS

| | | | |
|---|---|---|---|
| 3,705,316 A | 12/1972 | Burrous et al. | |
| 5,765,672 A * | 6/1998 | Briggs | F01P 11/14 123/41.11 |
| 5,798,854 A | 8/1998 | Blauvelt et al. | |
| 6,104,239 A | 8/2000 | Jenkins | |

(Continued)

FOREIGN PATENT DOCUMENTS

| CN | 2872495 Y | 2/2007 |
|---|---|---|
| DE | 3218439 A1 | 12/1983 |

(Continued)

OTHER PUBLICATIONS

ISA/CN International Search Report issued Aug. 1, 2013 re PCT Application No. PCT/CN2012/083375, filed Oct. 23, 2012.

(Continued)

*Primary Examiner* — Sibin Chen
(74) *Attorney, Agent, or Firm* — Robert A. Jefferis; Driggs, Hogg, Daugherty & Del Zoppo Co., LPA

(57) ABSTRACT

Disclosed are an apparatus and a method for transmitting an analog signal, and an analog signal multiplexer. The apparatus comprises a photocoupler to receive an input analog signal and transform the input analog signal into an output analog signal, which varies with the input analog signal in a manner of non-linearity. The apparatus further comprises a non-linearity correcting unit to receive the output analog signal and correct the non-linearity to output a corrected output analog signal. An analog signal may be transmitted with a photocoupler.

23 Claims, 13 Drawing Sheets

(56) References Cited

U.S. PATENT DOCUMENTS

| | | | |
|---|---|---|---|
| 6,239,956 B1 * | 5/2001 | Shirai | H03K 17/292 361/111 |
| 6,560,058 B1 * | 5/2003 | Hattori | G11B 5/5521 360/77.08 |
| 2007/0170171 A1 * | 7/2007 | Shah | G01R 19/0084 219/497 |

FOREIGN PATENT DOCUMENTS

| | | |
|---|---|---|
| EP | 0344091 A2 | 11/1989 |
| EP | 1871005 A1 | 12/2007 |
| JP | 58127134 A | 7/1983 |

OTHER PUBLICATIONS

Tao, Zhengfan, Non-linearity Correction of Photocoupler Transmission, Electric Engineering, Jan. 2001, No. 1, p. 30, col. 1, line 23, to col. 2, line 22, and figure 2.

European Patent Office partial suplementary European Search Report issued May 18, 2016 re application of ABB Technology Ltd., No. 12887319.7.

European Patent Office extended European Search Report issued Aug. 2, 2016 re application of ABB Technology Ltd., No. 12887319.7.

\* cited by examiner

_US 9,490,802 B2_

APPARATUS AND METHOD FOR TRANSMITTING AN ANALOG SIGNAL, AND ANALOG SIGNAL MULTIPLEXER

FIELD OF THE APPLICATION

The present application relates to analog signal transmission, and in particular, to an apparatus for transmitting an analog signal and a method for transmitting an analog signal. An analog signal multiplexer using the apparatus for transmitting an analog signal is also provided.

BACKGROUND OF THE APPLICATION

Analog signal is widely used in industrial automation for applications such as measurement input, analog control. In later 80s', HART (Highway Addressable Remote transducer) protocol adds frequency signal in the analog signal which enhances the use of analog signal to high level industrial automation like intelligent instrument and asset management. Such important usage as well as harsh industrial environment needs higher requirement for both signal accuracy and isolation for transmitting the analog signal.

There are three ways of analog signal isolation for now. The first is to use isolated switch (PhotoMos) which has high voltage withstand, the second is to use isolated linear amplifier with normal analog switch and the last is to use transformer with better linearity together with normal analog switch. All these methods can isolate analog signal and transfer signal with high linearity. Not to mention all of the components used in these methods are quite expensive, they are also relatively large and not suitable for minimizing product size.

SUMMARY OF THE APPLICATION

Hereinafter, there is provided a brief summary about the present application in order to provide a basic understanding on certain aspects of the application. However, it should be understood that this summary is not an exhaustive summary about the application. It is not intended to determine critical portions or important portions of the application, nor does it intend to limit the scope of the application. The object thereof is only to propose some concepts with respect to the application in a simplified form, thereby to be a prelude of the more detailed description given later.

According to an aspect of the application, there is provided an apparatus for transmitting an analog signal, comprising: a photocoupler configured to receive an input analog signal, and transform the input analog signal into an output analog signal, which varies with the input analog signal in a manner of non-linearity; and a non-linearity correcting unit configured to receive the output analog signal and correct the non-linearity to output a corrected output analog signal.

According to another aspect of the application, there is further provided an analog signal multiplexer, comprising a multiplexing switch and a plurality of the apparatus for transmitting an analog signal, with each switch channel of the multiplexer controlling one of the apparatus.

According to another aspect of the application, there is further provided a method for transmitting an analog signal, comprising: transforming, with a photocoupler, an input analog signal into an output analog signal, which varies with the input analog signal in a manner of non-linearity; and correcting the non-linearity with a non-linearity correcting unit arranged on an output side of the photocoupler.

According to another aspect of the application, there is further provided an apparatus for transmitting an analog signal, comprising: an input unit comprising at least one stage of input amplifier circuit to transform an input voltage signal into a current signal as an input analog signal; a photocoupler configured to transform the input analog signal into an output analog signal, which varies with the input analog signal in a manner of non-linearity; a non-linearity correcting device configured to compensate the non-linearity and generate a corrected output analog signal; and at least one output power amplifier circuit to amplify the corrected output analog signal; wherein the input unit further comprises a temperature drift compensating device, a constant current source and a compensating power amplifier to introduce into the input voltage signal a compensating temperature drift that corresponds to the temperature drift caused by the non-linearity correcting device.

BRIEF DESCRIPTION OF THE DRAWINGS

The application can be better understood by referring to the detailed description given hereinafter in combination with the accompanying drawings in which identical or similar components are denoted by identical or similar reference numbers. The accompanying drawings together with the detailed description below are included in the specification and form parts of the specification for further illustrating embodiments of the application and explaining principles and advantages of the application by way of example. Wherein.

DETAILED DESCRIPTION OF THE APPLICATION

Figure 1:
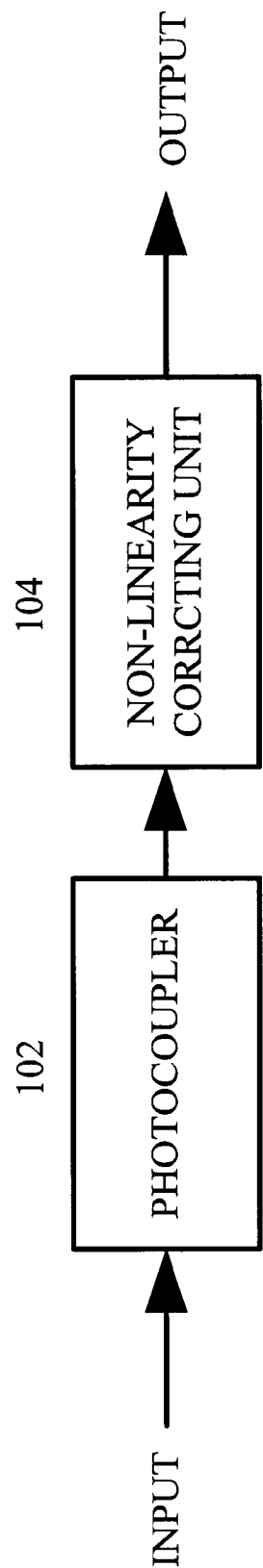
FIG. 1 is a block diagram illustrating an apparatus for transmitting an analog signal according to an embodiment of the present application.

Hereinafter, an exemplary embodiment of the application will be described in combination with the drawings. For the purpose of clarity and simplicity, not all the features of the actual embodiment are described in the specification. However, it should be appreciated that it has to make a lot of decisions specific to the embodiments during a process for developing any such actual embodiments in order to achieve specific targets of developers, for example, complying with those restrictive conditions related to systems and operations, and these restrictive conditions may vary with different embodiments. Further, it should also be appreciated that although developing work may be very complex and time-consuming, such developing work is merely a routine task for those skilled in the art who benefit from the present disclosure.

Further, for preventing unnecessary details from obscuring the application, only the device structures and/or processing steps closely related to the scheme according to the application are shown in the drawings, and other details having little to do with the application are omitted.

In addition, the term "connect" and its variations used in this disclosure are intended to cover both "direct connection" and "indirect connection". That is, when it is mentioned that one device or circuit is connected to another device or circuit, there may be or may be no other device(s) and/or circuit(s) interposed between the one device or circuit and the other device or circuit.

Schematic Configuration of the Apparatus

Compared with the PhotoMos and isolated linear amplifier, photocoupler is quite small and also has high voltage withstand. Moreover, the price of commonly used photocoupler is quite cheaper compared to other components used for isolation. However, generally the current transfer ratios of photocouplers are discrete and nonlinear. Thus when using different photocouplers to transmit an analog signal, non-linearity (discreteness) will be caused between the input analog signal and the different output analog signals with respect to different photocouplers.

In order to overcome the above mentioned problem, the inventor of the present application proposes that, when a commonly used photocoupler is used to transmit and isolate an analog signal, said non-linearity can be corrected by adding at the output side of the photocoupler a non-linearity correcting unit. The non-linearity between the input and output analog signal can then be corrected by the non-linearity correcting unit before the analog signal being output. Thus, the high cost for eliminating the non-linearity during the transmission, such as using quite expensive isolated switch (e.g. PhotoMos and isolated linear amplifier), can be greatly reduced.

The above mentioned non-linearity correcting unit may be configured to be capable of generating at least a non-linear signal variation that corresponds to the non-linear variation between the input and output analog signals transmitted through the photocoupler. The non-linearity correcting unit is provided at the output side of the photocoupler, thus the non-linear variation between the input and the output analog signals output by the photocoupler can be corrected (compensated) by the corresponding non-linear signal variation generated from the non-linearity correcting unit.

The inventor of the application notices that the current transfer ratios of most photocouplers are linear for a small current in the characteristic curve in log-log coordinates of the current transfer ratio. Therefore, the inventor proposes to make use of the log-log linear region of the photocoupler, and provide a correcting device having the same non-linearity property to correct the non-linearity in the output of the photocoupler. In this case, as explained above, the photocoupler is configured to work at least in a linear area of a characteristic curve in log-log coordinates of its current transfer ratio and a non-linearity transmitting relationship is found between the input and output analog signals transmitted through the photocoupler. Meanwhile, the non-linearity correcting unit provided at the output side of the photocoupler is configured to also work on at least part of its characteristic curve in log-log coordinates, and thus generate a corresponding non-linear signal variation so that the non-linearity relationship between the input and output signals is corrected by the non-linear signal variation generated from the non-linearity correcting unit. As will be described below, at least one diode or a junction of at least one transistor can be used as an example of the non-linearity correcting unit having the linear characteristic curve in log-log coordinates. By doing so, an isolated analog signal can be transferred in linear manner with high accuracy and the solution is quite cheaper with smaller product size, compared with the prior art.

Here, the inventor notices that the linearity on at least part of the characteristic curves in log-log coordinates of the photocoupler and the diode or transistor is an inherent performance thereof, and what need be done is just to make them work in the linear areas of their characteristic curves in log-log coordinates.

Specifically, as shown in FIG. 1, the apparatus for transmitting an analog signal comprises a photocoupler 102 configured to receive an input analog signal and transform the input analog signal into an output analog signal, which varies with the input analog signal in a manner of non-linearity; and a non-linearity correcting unit 104 configured to receive the output analog signal and correct the non-linearity to output a corrected output analog signal.

Figure 2:
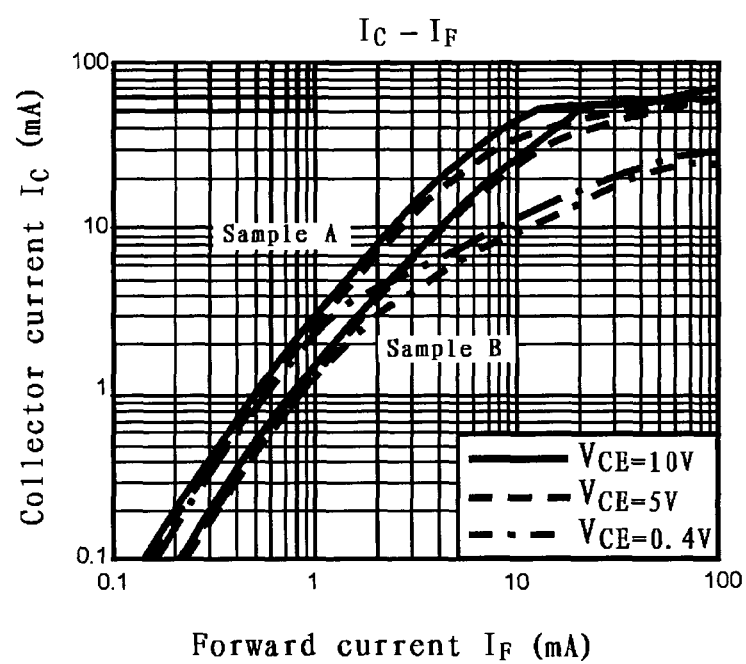
FIG. 2 shows a current transfer ratio of a commonly used photocoupler.

In the following description, the principle of the present application will be further described in detail. Referring to FIG. 2, assuming that the current transfer ratio of the photocoupler is linear in the characteristic curve in log-log coordinates of the current transfer ratio with slope k for small current (less than 1 mA), and $I_{F1}$ and $I_{C1}$ are values of $I_F$ and $I_C$ in linear log-log coordinates, then the following Equation 1 can be obtained:

$$10 \lg I_C = k*10 \lg I_F - k*10 \lg I_{F1} + 10 \lg I_{C1} \quad \text{(Eq 1)}$$

As can be seen from the figure, although the current transfer ratio is different from sample to sample (namely, different photocoupler samples lead to different $I_C$ or $I_{C1}$), the slope k of these samples in log-log coordinates can be deemed as almost the same. So we can get Equations 2, 3 and 4 based on Equation 1.

$$I_C = I_F^k * I_{F1}^{-k} * I_{C1} \quad \text{(Eq 2)}$$

$$\frac{\partial I_C}{\partial I_F} = k I_F^{k-1} * I_{F1}^{-k} * I_{C1} \quad \text{(Eq 3)}$$

$$\Delta I_C = k I_F^{k-1} * I_{F1}^{-k} * I_{C1} * \Delta I_F \quad \text{(Eq 4)}$$

As can been seen from later description, when a dynamic resistance $R_D$ (expressed as $V_T/I_C$) of a diode D or a junction of a transistor, which is used as a non-linearity correcting device, is introduced as the output resistance of the photocoupler, the discreteness between $\Delta I_C$ and $\Delta I_F$ caused by discrete $I_C$ ($I_{C1}$) (namely the same forward input analog signal (current signal) $I_F$ resulting to different or discrete output currents $I_C$ with respect to different photocoupler samples (shown by Eq 3 and FIG. 2)), can be corrected by eliminating the discrete $I_C$ ($I_{C1}$) from the final expression of the output voltage $U_O$ based on the above mentioned equations, thus a linear transmission between the input voltage $U_I$ and output voltage $U_O$ can be obtained, as shown in Eq 10 which will be described later.

Embodiments of the Non-Linearity Correcting Unit of the Apparatus for Transmitting Analog Signal As shown in FIGS. 3-6, the non-linearity correcting unit may comprise a correcting device. The correcting device may comprise a diode or a transistor but is not limited thereto. As shown in FIGS. 3-6, the correcting device may be in series with the output side of the photocoupler, and the assembly comprising the correcting unit and the photocoupler is connected to a constant voltage supply, with a voltage across the output side of the photocoupler or a voltage across the correcting unit taken out as a corrected output analog signal.

Figure 3:
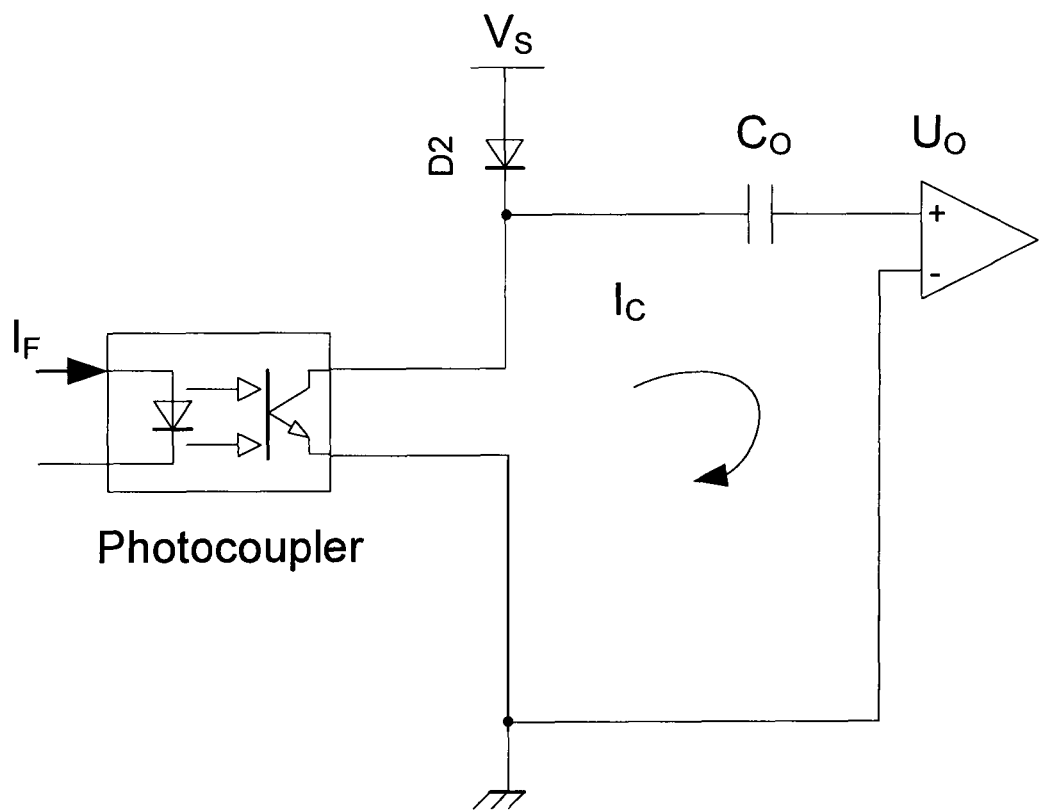
FIG. 3 shows a first embodiment of the circuit structure of the block diagram shown in FIG. 1.
Figure 4:
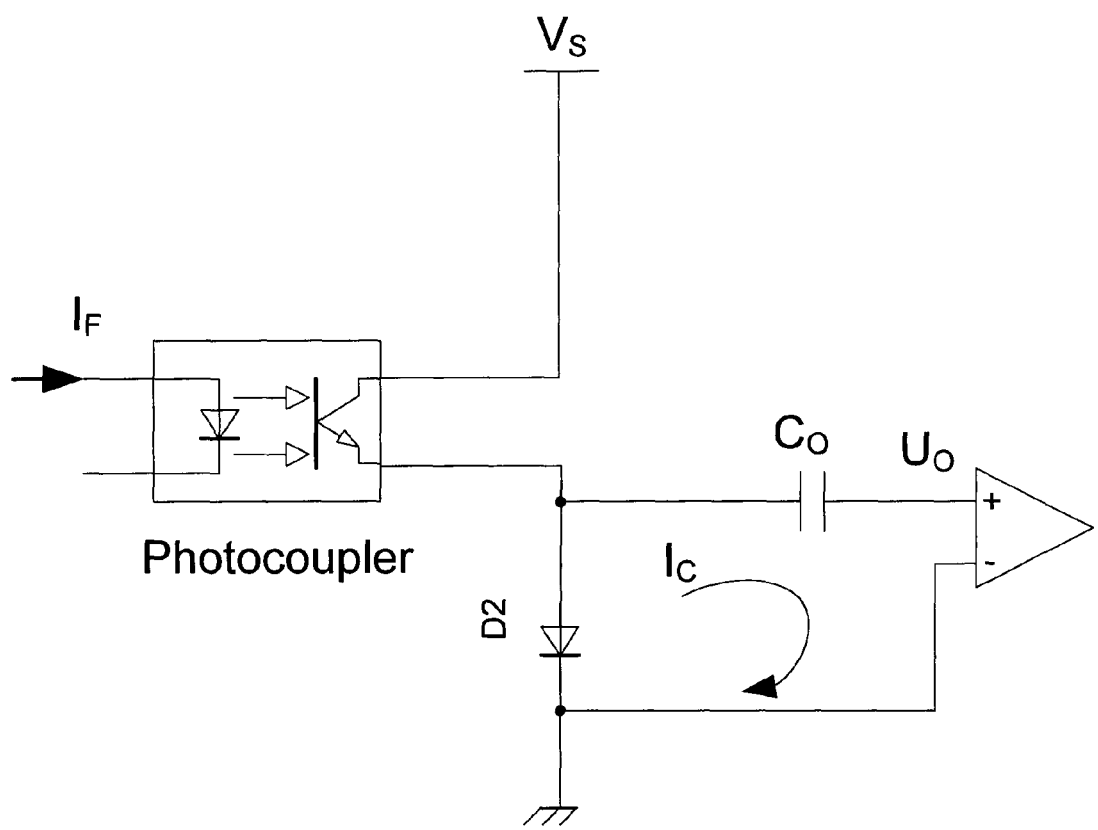
FIG. 4 shows a modification of the first embodiment of the circuit structure of the block diagram shown in FIG. 1.
Figure 5:
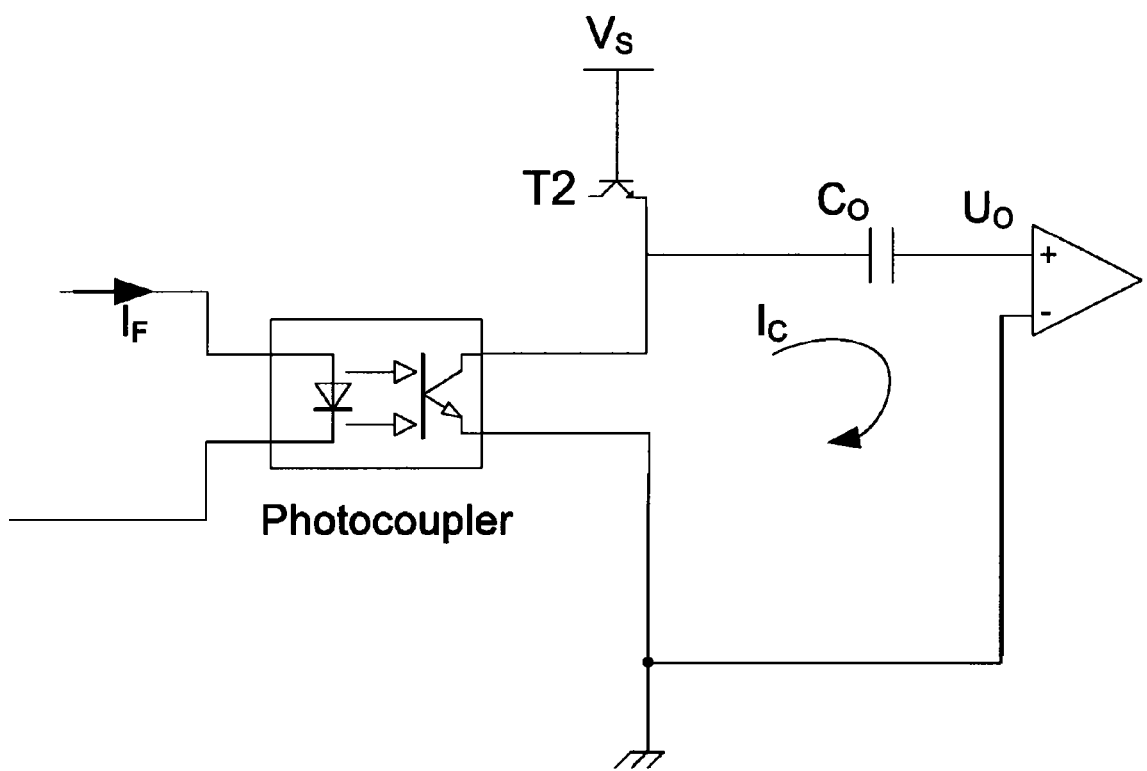
FIG. 5 shows a second embodiment of the circuit structure of the block diagram shown in FIG. 1.
Figure 6:
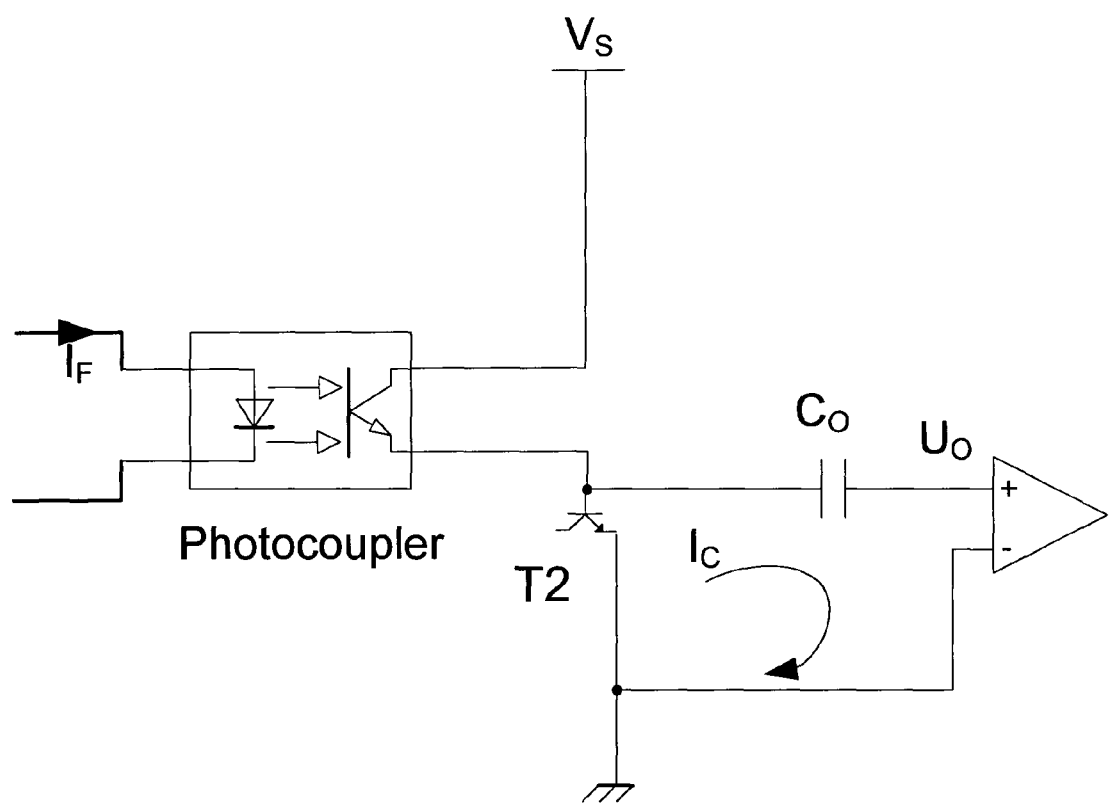
FIG. 6 shows a modification of the second embodiment of the circuit structure of the block diagram shown in FIG. 1.

As shown in FIGS. 3 and 5, the correcting device may be connected between the constant voltage supply and a collector side of the photocoupler, with a voltage across the photocoupler taken out as the corrected output analog signal. Or, as shown in FIGS. 4 and 6, the correcting device may be connected to an emitter side of the photocoupler, with a voltage across the correcting device taken out as the corrected output analog signal.

The first embodiment of the non-linearity correcting unit will be described by referring to FIG. 3. It can be seen there from that the photocoupler receives at the input side the input analog signal $I_F$ and transforms the same into output analog signal $I_C$ at the output side. As described above, the non-linearity between the input analog signal $I_F$ and the output analog signal $I_C$ can be expressed as Eq 3 and Eq 4. Moreover, in this figure a diode D2 is used as the non-linearity correcting device. The forward biased input of the non-linearity correcting diode D2 is connected to a constant voltage source $V_S$ and the reverse biased input is connected to the collector side of the photocoupler. Furthermore, the dynamic resistance $R_{D2}$ of diode D2 can be formulated by the following equation 5:

$$R_{D2} = \frac{V_T}{I_C} \quad (Eq\ 5)$$

Thermal voltage $V_T$ of diode D2 is formulated by equation 6:

$$V_T = \frac{k_B * T_K}{e} \quad (Eq\ 6)$$

Where $k_B$ is the Boltzmann constant, $T_K$ is environmental temperature (absolute temperature), e is elementary charge. So the thermal voltage of diode is linear to the environmental temperature.

From equations 2, 4, 5 and 6, if $\Delta I_C$ is small enough compared to $I_C$, we can get following equation 7

$$\Delta U_0 = -\Delta I_C * R_{D2} = \quad (Eq\ 7)$$

$$kI_F^{k-1} * I_{F1}^{-k} * I_{C1} * \Delta I_F * \frac{V_T}{I_F^k * I_{F1}^{-k} * I_{C1}} = kI_F^{-1} * \Delta I_F * V_T$$

It can be seen from Eq 7 that by introducing the dynamic resistance $R_{D2}$ of the correcting device D2, the non-linear or discrete change caused by $I_C$ ($I_{C1}$) between the output voltage $\Delta U_O$ and the input analog signal $\Delta I_F$ is eliminated. Namely the discreteness (non-linearity) between the input analog signal and the output analog signal caused by using different photocoupler is eliminated.

It should also be noted that although in FIG. 3 only one diode is used as the non-linearity correcting unit, two or more diodes connected in series can be used as the non-linearity correcting unit. In other words at least one diode can be used as the non-linearity correcting device.

FIG. 4 shows a modification of the non-linearity correcting unit shown in FIG. 3. In this modification the diode D2, which is used as the correcting device, is connected to the emitter side of the photocoupler and the voltage across D2 is taken out as the corrected output analog signal. It can be seen from FIG. 4 that the principle of this modification is the same with the first embodiment, the only difference there between is that the phase of the output analog signal is the same with the input analog signal, therefore Eq 7 should be presented as:

$$\Delta U_0 = \Delta I_C * R_{D2} = kI_F^{k-1} * I_{F1}^{-k} * I_{C1} * \Delta I_F * \frac{V_T}{I_F^k * I_{F1}^{-k} * I_{C1}} = kI_F^{-1} * \Delta I_F * V_T$$

As described in the first embodiment, more than one diode that is connected in series can be used as the non-linearity correcting device in this modification.

In the above described embodiments, at least one diode is used as the non-linearity correcting device. However, except for the diode, at least one transistor can also be used as the non-linearity correcting unit.

The second embodiment of the non-linearity correcting unit is shown in FIG. 5. The configuration of the second embodiment is the same with that of the first embodiment except for the non-linearity correcting device D2 is replaced with at least one transistor T2. Specifically, as shown in FIG. 5, a junction of a transistor T2 is used as the non-linearity diode. In the case, the base of the transistor T2 is connected to the constant voltage source while the emitter of the transistor T2 is connected to the collector side of the photocoupler. In other words, the junction between the base and the emitter of the transistor T2 is used as the non-linearity correcting device. It is can be seen clearly from FIG. 5 that the principle of the second embodiment is the same with the first embodiment because in this configuration of the transistor T2, the junction between the base and the emitter thereof can actually be deemed as a forwardly biased diode and can be used as the correcting device.

FIG. 6 shows a modification of the second embodiment of the non-linearity correcting unit. As can be seen from FIG. 6, the circuit structure is the same with that of the modification of the first embodiment, except that the diode D2, which is used as the non-linearity correcting device, is replaced with a transistor T2. In other words, a junction of the transistor T2 is used as the non-linearity correcting device. It can be understood according to the above description that the principle of the modification of the second embodiment is the same with the above mentioned embodiment, namely a junction of the transistor T2 is used as a forward biased diode so as to function as a non-linearity correcting device.

Moreover, it can be seen from FIG. 3 to FIG. 6 that the non-linearity correcting unit also comprises a capacitor $C_O$ and/or an output amplifying circuit $U_O$. In this application the capacitor $C_O$ may be used to filter off unwanted DC component from the photocoupler or the correcting device and the output amplifying circuit $U_O$ may be configured to further amplify the corrected output analog signal if necessary.

From above it could be seen that in the embodiments, Ic is the bridge between Eq 4 and Eq 5 and is finally cancelled off. Therefore, in the embodiments where the non-linearity correcting unit is in series with the output side of the photocoupler, the current Ic shall be in both the linear area of the characteristic curve in log-log coordinates of the current transfer ratio of the photocoupler, and the linear area of the characteristic curve in log-log coordinates of the diode or transistor.

Figure 7:
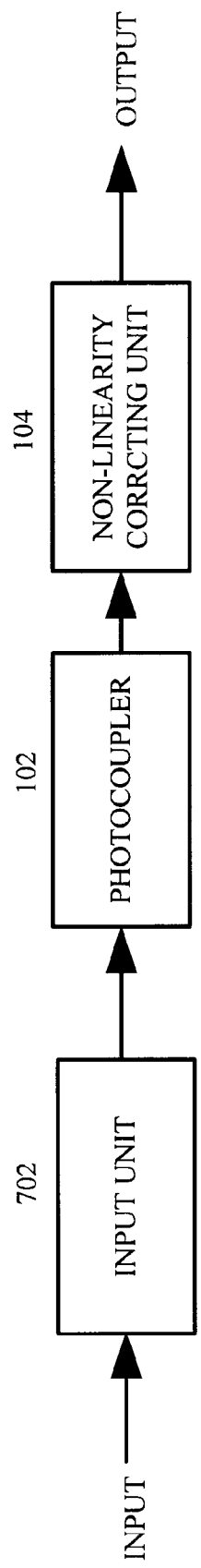
FIG. 7 shows another block diagram illustrating an apparatus for transmitting an analog signal according to an embodiment of the present application.

Embodiments of the Apparatus for Transmitting an Analog Signal with an Input Unit FIG. 7 shows another block diagram illustrating an embodiment of an apparatus for transmitting an analog signal according to the present application. The difference between this block diagram and that shown in FIG. 1 is that an input unit 702 is added in FIG. 7.

When using a photocoupler to transmit/isolate an analog signal, generally a current signal is required to be used as the input signal. Accordingly, when the input signal is a voltage signal, a transformation from voltage signal into current signal is required. Therefore the input unit is provided so as to transform an input analog signal, which is usually in the form of a voltage signal, to be a current signal. As an example, the input unit 702 comprises an amplifying unit comprising at least one stage of amplifying circuit to amplify the input voltage signal.

Figure 8:
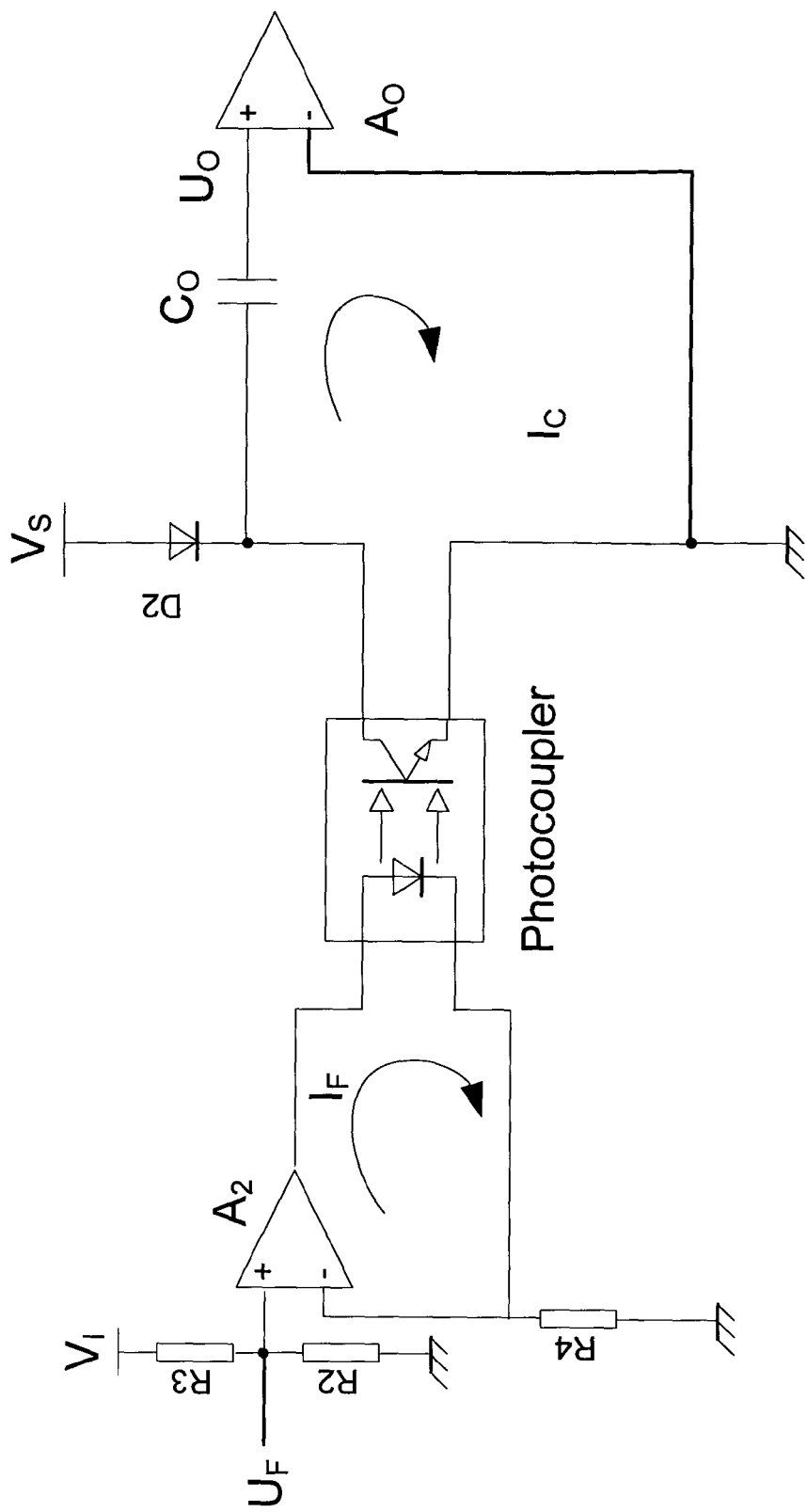
FIG. 8 shows an exemplified circuit structure of the block diagram shown in FIG. 7.

In one embodiment of the amplifying circuit, at least one stage of amplifying circuit comprises at least one power amplifier. FIG. 8 shows an exemplified circuit structure of the block diagram shown in FIG. 7. In FIG. 8 the input unit 702 or the amplifying unit may comprise a power amplifier $A_2$, which can be referred to as transforming amplifier, and resistors R2, R3 and R4. When the provided input signal is in the form of voltage signal $U_F$, this input signal can then be transformed to be a current signal $I_F$ as presented blow.

$$I_F = \frac{U_F}{R4}$$

Figure 9:
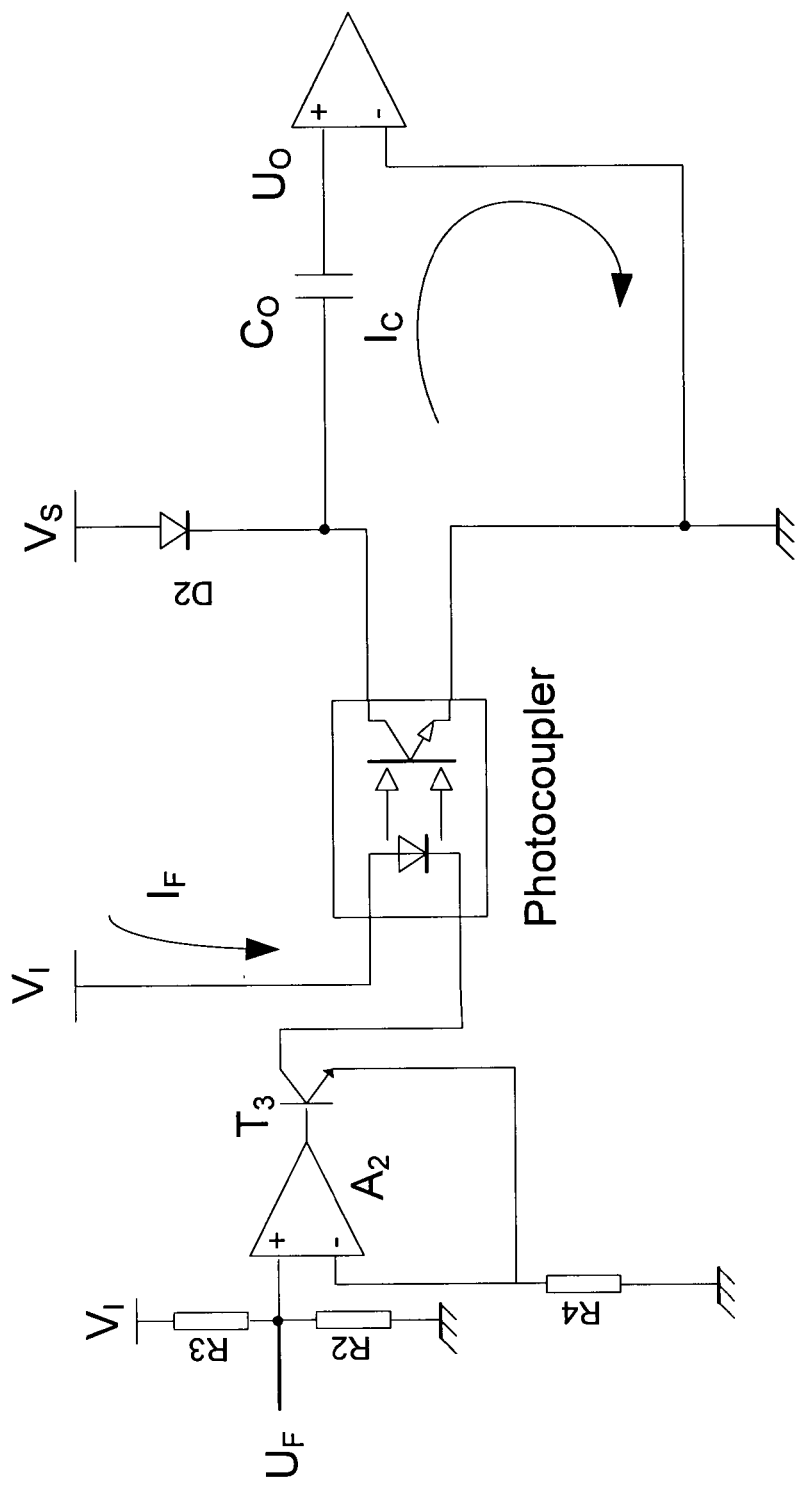
FIG. 9 shows another exemplified circuit structure of the block diagram shown in FIG. 7.
Figure 10:
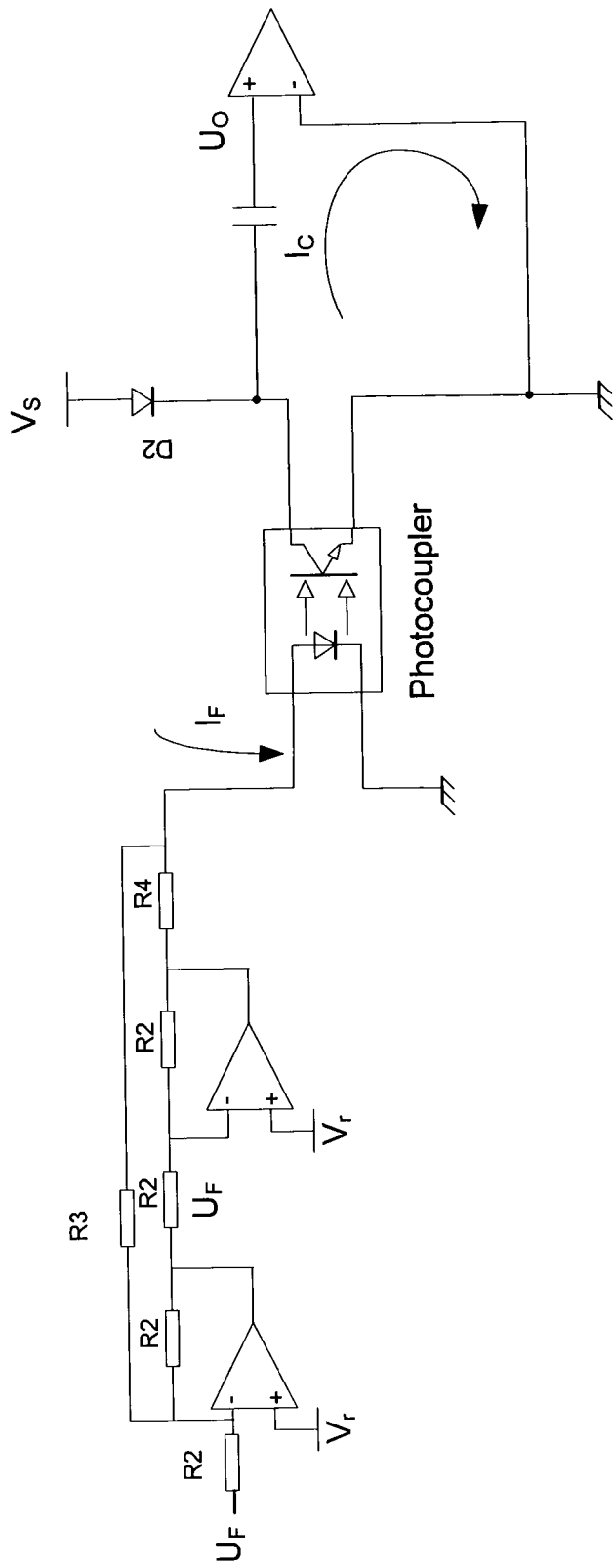
FIG. 10 shows yet another exemplified circuit structure of the block diagram shown in FIG. 7.

Moreover, other embodiments of the input unit are also shown in FIGS. 9 and 10. For instance, the last stage of the amplifying circuit may comprise a transistor. FIG. 9 shows an exemplified circuit structure in which an amplifying transistor T3 is added at the output of the transforming amplifier $A_2$ so as to further amplify the current component $I_F$. While FIG. 10 shows that a multiple stage amplifying circuit comprising more than one transforming power amplifier $A_2$ is used to amplify the current component $I_F$.

Please note that although in FIGS. 8-10 the right side of the figures is shown as the same as FIG. 3, it can also be embodied as the same as FIGS. 4-6.

Embodiments of the Apparatus for Transmitting an Analog Signal with a Temperature Drift Compensating Unit The above embodiments according to the present application can correct the non-linearity transmission caused by the photocoupler by eliminating the discreteness in the output current $I_C$ of the photocoupler. However, as can be seen from Eq 7, although the non-linearity (discreteness) caused by $I_C$ is eliminated, the thermal voltage $V_T$ of the correcting device, which varies depending on temperature $T_K$, is introduced into the output voltage $\Delta U_O$. This equals that the output voltage $\Delta U_O$ is affected by a temperature drift of the non-linearity correcting diode D2.

The above mentioned embodiments can be applied to the case of constant temperature environment, in which the effect of the environment can be ignored and the temperature drift caused by $V_T$ is not significant. Thus the non-linearity between the input analog signal and output analog signal is corrected without needing further temperature drift compensation.

Nevertheless, there are also cases in which the environmental temperature, such as that in the working environment for practicing HART protocol, is not constant and the effect of the same cannot be ignored. For the purpose of practical utilization of HART, the temperature drift caused by such correcting diode may be compensated. The inventor of the present application accordingly proposes a circuit structure using a temperature drift compensating unit to compensate a temperature drift caused by the non-linearity correcting unit. As an example, similar to the non-linearity correcting unit, the temperature drift compensating unit may comprise a compensating device, which may comprises at least one diode or at least one transistor so as to compensate the temperature drift caused by the non-linearity correcting unit. However, the compensating device is not limited to the diode or the transistor. The structure of the circuit will be described in detail as follows.

Figure 11:
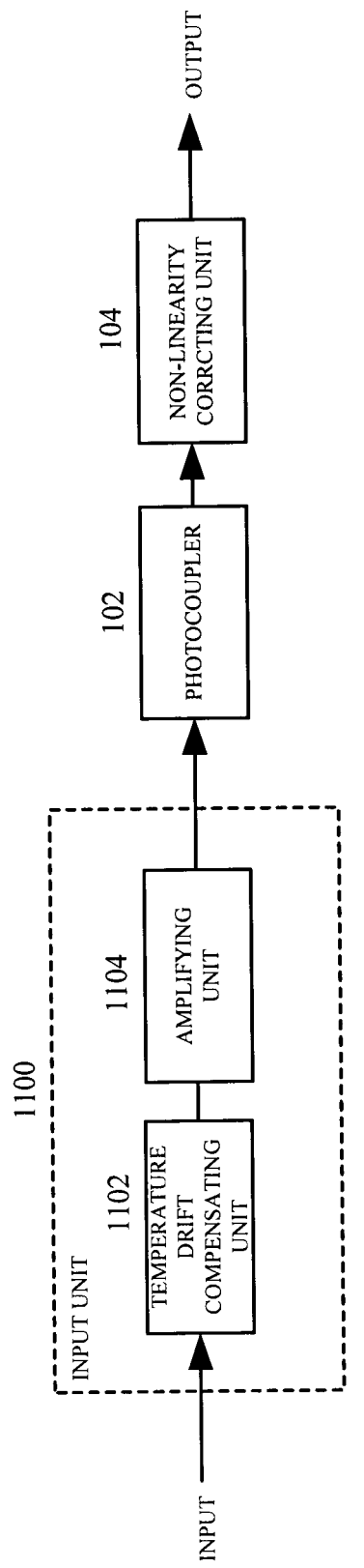
FIG. 11 shows a block diagram illustrating another embodiment of an apparatus for transmitting an analog signal, wherein a temperature drift compensating unit is provided in the input unit.

Referring to FIG. 11, wherein the input unit 1100 may comprise a temperature drift compensating unit 1102 and an amplifying unit 1104. It should be noted that the amplifying unit 1104 indicated in this block diagram functions as the input unit 702 shown in FIG. 7, whereas the temperature drift compensating unit 1102 is introduced as a new component for compensating the temperature drift caused by the thermal voltage $V_T$ of the non-linearity correcting device.

Figure 12:
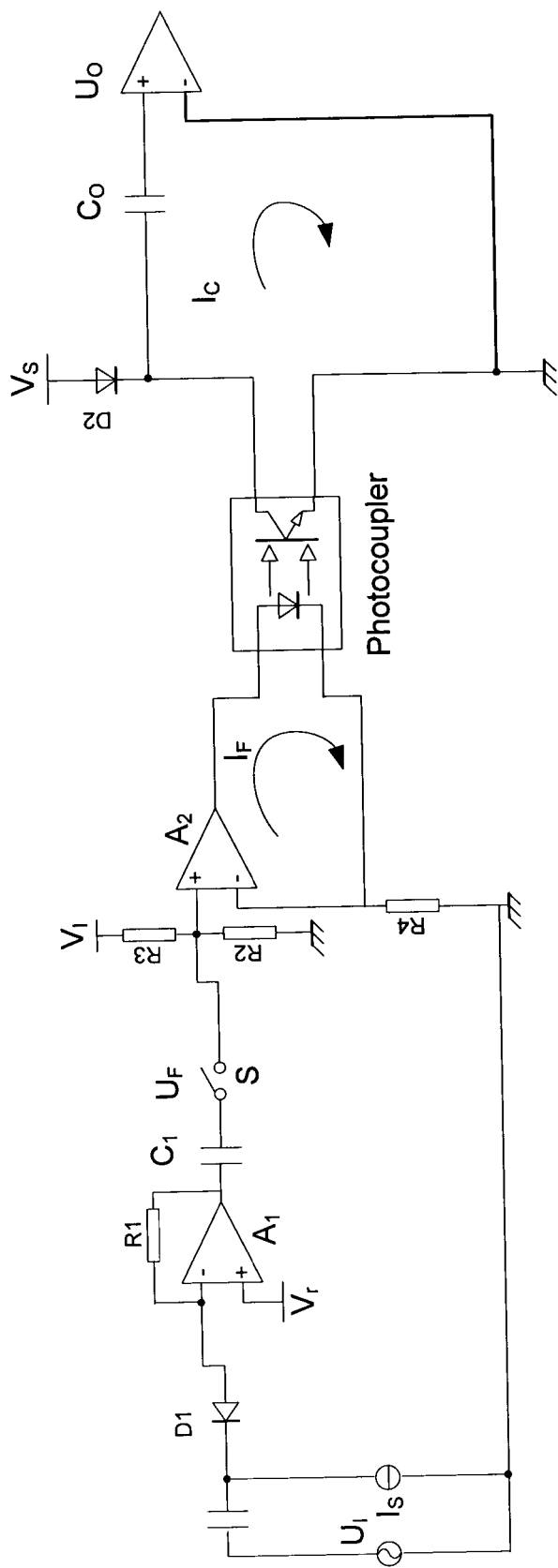
FIG. 12 shows an exemplified embodiment of the apparatus for transmitting an analog according to the block diagram illustrated in FIG. 11.
Figure 13:
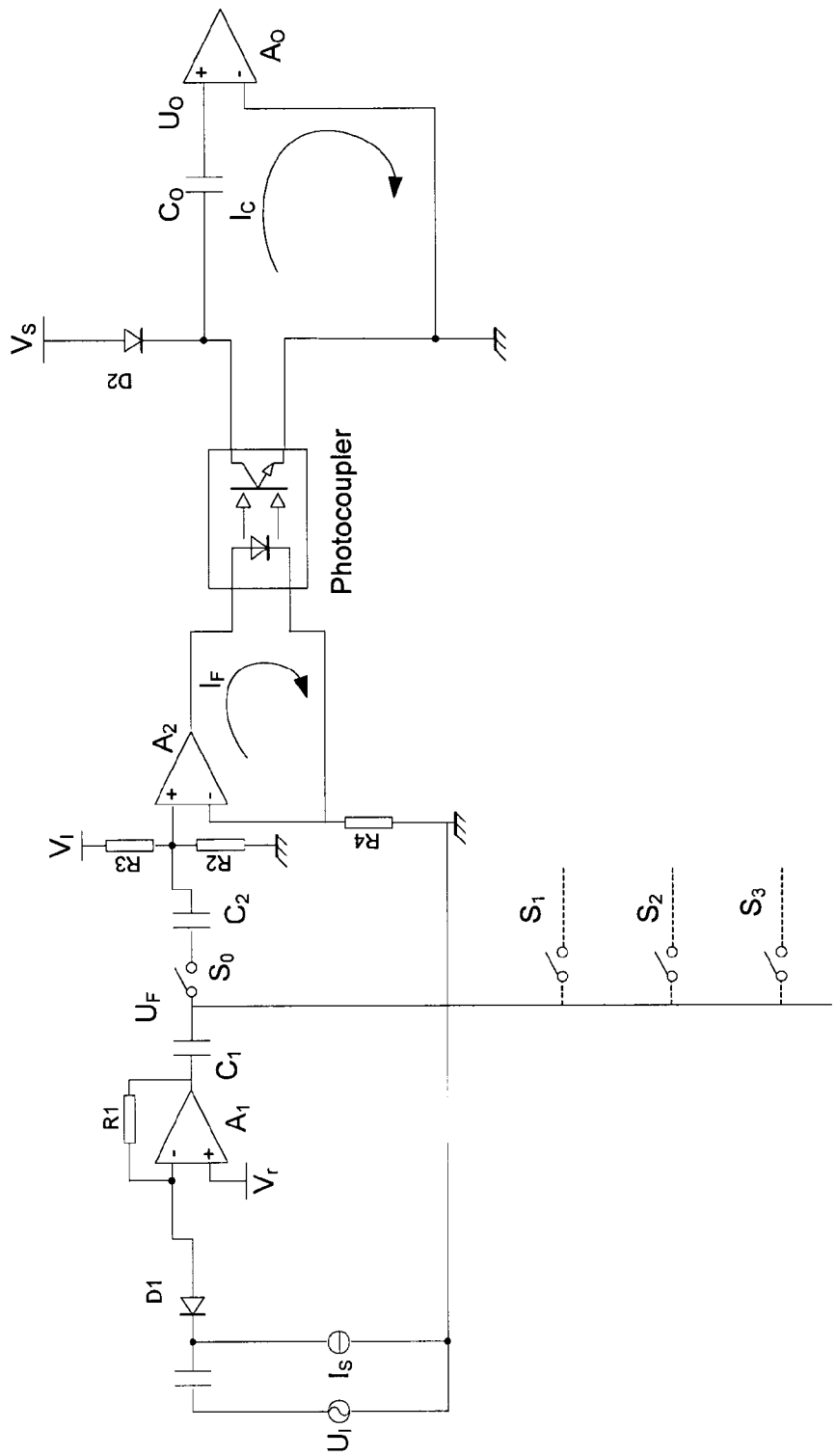
FIG. 13 shows an exemplified circuit structure of an analog signal multiplexer according to an embodiment of the present application.

FIG. 12 shows an exemplified circuit structure of the apparatus for transmitting the analog signal. The left part of this circuit shows an embodiment of the temperature drift compensating unit for compensating the temperature drift caused by the thermal voltage $V_T$ of the non-linearity correcting device D2. Please note that although the other parts in FIGS. 12 and 13 are shown as the same as in FIG. 8, it should be appreciated that the other parts in FIGS. 12 and 13 may be implemented according to any embodiment discussed above.

Referring to FIG. 12, the temperature drift compensating unit 1102 may comprise a compensating device, a constant current source and a compensating power amplifier circuit to introduce into the input voltage signal a compensating temperature drift that corresponds to the temperature drift caused by the correcting device. The compensating power amplifier circuit may comprise a compensating power amplifier $A_1$ configured to amplify and transmit the temperature drift compensating signal generated from the diode D1 to the input side of the amplifying unit 1104. A capacitor $C_1$ may be provided at the output side of the amplifier $A_1$, which is used to filter off the unnecessary DC component output from the amplifier $A_1$. In the amplifier $A_1$ the non-inverting input thereof is connected to a reference voltage $V_r$ so as to keep the amplifier $A_1$ work in a proper linear working region while the inverting input of the amplifier $A_1$ is connected to the forward input of the temperature compensating diode D1. A constant current source $I_S$ is connected to the reverse input of the diode D1.

Further, it should also be noted that in the middle part of FIG. 12 a common analog switch S with no isolation may be provided for transmitting the analog signal. In the present application the isolation is realized by means of commonly used photocoupler rather than expensive isolating linear switch such as PhotoMos, therefore the cost of the analog signal transmitting apparatus can be greatly reduced.

According to the circuit structure as shown in the left part of FIG. 12, the forward biased voltage of D1 is clamped at the reference voltage $V_r$, thus ensuring that the compensating diode D1 is forward biased and conducted. Meanwhile, since the constant current source $I_S$ is connected to the reverse input of the diode D1, the dynamic resistance of D1 can be expressed as $R_{D1}=V_T/I_S$ (Eq 8). It is also seen from FIG. 12 that the AC analog signal source $U_I$ is superimposed on the direct voltage component $V_r$, so that the signal of the analog signal source $U_I$, together with the temperature drift compensating signal generated from the compensating unit can be delivered to the subsequent circuit part till the input side of the photocoupler.

Further referring to the left part of FIG. 12, as for the AC voltage components $U_I$ and $U_F$, we can obtain the following equation:

$$\frac{U_F}{R_1} = -\frac{U_I}{R_{D1}}$$

Furthermore, by means of the voltage-current conversion amplifying circuit described above, we can obtain the following relationship between the input analog signal $\Delta I_F$ and $U_F$, $$\Delta I_F = \frac{U_F}{R4}$$

Then we can obtain from the above two equations together with the dynamic resistance $R_{D1}=V_T/I_S$ (Eq 8) the following equation 9:

$$\Delta I_F = \frac{U_F}{R4} = -\frac{R1}{R_{D1}*R4}U_I = \frac{-I_S*R1}{V_T*R4}U_I \qquad \text{(Eq 9)}$$

From equations 7 and 9, we can get the following equation 10, wherein $V_T$ is eliminated in the final equation and change of the output voltage $\Delta U_0$ is linear to the input voltage $I_I$ because $I_S$, R1, R4 and $I_F$ can be controlled as constants and k is the same for all photocouplers, and the temperature drift caused by the non-linearity correcting device D2 is compensated.

$$\Delta U_0 = kI_F^{-1}*V_T*\frac{I_S*R1}{V_T*R4}U_I = \frac{I_S*R1*kI_F^{-1}}{R4}U_I \qquad \text{(Eq 10)}$$

It should be noted that in this embodiment only one diode is used as the non-linearity correcting device or the temperature drift compensating device. However, more than one diode, such as two, three or more diodes, can be used as the linearity correcting device or the temperature drift compensating device.

It should also be noted that, as shown in equation Eq 6, the value of the thermal voltage $V_T$ only depends on the Boltzmann constant $k_B$, the environmental temperature $T_K$ (absolute temperature) and elementary charge e. Therefore there is no special restriction on the types or parameters of the diode used as the temperature drift compensating device. Namely, as far as the dynamic resistance $R_D=V_T/I_S$ is introduced to compensate the temperature drift, any commonly-used diode can be used.

Moreover, as indicated above, not only diode but also transistor (at least one transistor) can also be used as the temperature drift compensating device.

From above description, it could be seen that also provided are the following technical solutions. As one embodiment of the apparatus for transmitting an analog signal with photocoupler, it comprises: an input unit comprising at least one stage of input amplifier circuit to transform an input voltage signal into a current signal as an input analog signal; a photocoupler configured to transform the input analog signal into an output analog signal, which varies with the input analog signal in a manner of non-linearity; a non-linearity correcting device configured to compensate the non-linearity and generate a corrected output analog signal; and at least one output power amplifier circuit to amplify the corrected output analog signal; wherein the input unit further comprises a temperature drift compensating device, a constant current source and a compensating power amplifier to introduce into the input voltage signal a compensating temperature drift that corresponds to the temperature drift caused by the non-linearity correcting device.

In another embodiment, the photocoupler may be configured to work at least in a linear area of a characteristic curve in log-log coordinates of its current transfer ratio and the non-linearity correcting device comprises at least one diode or at least one transistor with linear property in at least part of its characteristic curve in log-log coordinates, the non-linearity correcting device is in series with the output side of the photocoupler, and the assembly comprising the non-linearity correcting device and the photocoupler is connected to a constant voltage supply, with a voltage across the output side of the photocoupler or a voltage across the non-linearity correcting device taken out as a corrected output analog signal.

In yet another embodiment, the temperature drift compensating device may comprises at least one diode or at least one transistor. Moreover, a forward input of the temperature drift compensating device is connected to an inverting input of the compensating power amplifier, with an inverse input of the temperature drift compensating device being connected to the constant current source and an analog signal source, and a reference voltage being connected a non-inverting input of the compensating power amplifier.

Embodiments of Analog Signal Multiplexer

The application also provides an analog signal multiplexer, comprising a multiplexing switch and a plurality of the apparatus for transmitting an analog signal according to any embodiment discussed above, with each switch channel of the multiplexer controlling one of the apparatus (not shown).

In one embodiment, the plurality of the apparatus for transmitting an analog signal may share a common temperature drift compensating unit arranged upstream of the multiplexing switch. FIG. 13 shows an exemplified circuit structure of such an analog signal multiplexer. The circuit structure of the analog signal multiplexer is the same with the embodiments of the apparatus for transmitting an analog signal discussed above, except that a plurality of analog switches with no isolation $S_0$, S1, $S_2$, $S_3$ . . . are added at the output of the compensating power amplifier $A_1$. In this embodiment each switch channel of the multiplexer controls one of the apparatus and a second capacitor $C_2$ may be added downstream of the multiplexing switch so as to isolate disturbing components from the other switch channels of the multiplexing switch.

In the embodiment shown in FIG. 13, a plurality of channels for transmitting the analog signal using photocoupler may share one temperature drift compensating unit comprising diode D1, amplifier $A_1$ and the first capacitor $C_1$. The analog signal multiplexer according to the present embodiment can selectively choose an analog transmitting channel by means of the switches $S_0$, S1, $S_2$, $S_3$ . . . . A plurality of signal transmitting channels sharing one temperature drift compensating unit can further reduce the cost of the analog signal multiplexer. It should also be noted that, as can be seen from FIG. 13, the second capacitor $C_2$ may also be used as the first capacitor $C_1$ for filtering off the unnecessary DC components. That is, for each switch channel, the capacitor $C_1$ and the capacitor $C_2$ may be merged as one. That is, the capacitor $C_1$ may be omitted.

Method for Transmitting an Analog Signal

From above description of the apparatus for transmitting an analog signal, it can be seen that the present application also proposes a method for transmitting analog signal with commonly used photocoupler as described below. When using a photocoupler to transmit an analog signal, transform with the photocoupler an input analog signal into an output analog signal, which varies with the input analog signal in a manner of non-linearity, then correct the non-linearity of the photocoupler with a non-linearity correcting unit arranged on an output side of the photocoupler.

In the method as described above, the photocoupler may be configured to work at least in a linear area of a characteristic curve in log-log coordinates of its current transfer ratio and the non-linearity correcting unit may comprise a correcting device with linearity property in at least part of its characteristic curve in log-log coordinates.

Further, the correcting device used to correct the non-linearity can comprise at least one correcting diode or at least one correcting transistor, which is forward biased by a constant voltage supply.

In another embodiment, the temperature drift caused by the non-linearity correcting unit can be compensated with a temperature drift compensating unit arranged on an input side of the photocoupler. The temperature drift compensating unit may comprise a compensating device comprising at least one compensating diode or at least one compensating transistor, and the compensating diode or a junction of the compensating transistor being forward biased to introduce into the input analog signal a compensating temperature drift that corresponds to the temperature drift caused by the non-linearity correcting unit.

Although the application and advantages thereof have been described in detail herein, it shall be understood that various changes, replacements and modifications may be made by one skilled in the art without departing from the spirit and scope of the application defined by the appended claims. Furthermore, the terms "comprise", "include" or any other variation thereof are intended to cover a non-exclusive inclusion, so that a process, method, article, or device that comprises a list of elements includes not only those elements but also other elements not explicitly listed or inherent to such process, method, article, or device. Unless further defined, a sentence "comprises a/an . . . " which defines an element does not preclude the existence of additional identical element(s) in the process, method, article, or device that comprises the element.

I claim:

1. An apparatus for transmitting an analog signal, comprising:
    a photocoupler configured to receive an input analog signal and transform the input analog signal into an output analog signal, which varies with the input analog signal in a manner of non-linearity;
    a non-linearity correcting unit configured to receive the output analog signal and correct the non-linearity to output a corrected output analog signal;
    an input unit to transform an input voltage signal into a current signal as the input analog signal;
    wherein the input unit further comprises a temperature drift compensating unit to compensate a temperature drift caused by the non-linearity correcting unit; and
    wherein the temperature drift compensating unit comprises a compensating device, a constant current source and a compensating power amplifier to introduce into the input voltage signal a compensating temperature drift that corresponds to the temperature drift caused by the non-linearity correcting unit.

2. The apparatus according to claim 1, wherein the photocoupler is configured to work at least in a linear area of a characteristic curve in log-log coordinates of its current transfer ratio and the non-linearity correcting unit comprises a correcting device with linear property in at least part of its characteristic curve in log-log coordinates.

3. The apparatus according to claim 2, wherein the correcting device is in series with the output side of the photocoupler, and the assembly comprising the correcting unit and the photocoupler is connected to a constant voltage supply, with a voltage across the output side of the photocoupler or a voltage across the correcting unit taken out as the corrected output analog signal.

4. The apparatus according to claim 3, wherein the correcting device is connected between the constant voltage supply and a collector side of the photocoupler, with a voltage across the photocoupler taken out as the corrected output analog signal.

5. The apparatus according to claim 3, wherein the correcting device is connected to an emitter side of the photocoupler, with a voltage across the correcting device taken out as the corrected output analog signal.

6. The apparatus according to claim 3, wherein the correcting device comprises at least one correcting diode or at least one correcting transistor, the correcting diode or the junction of the correcting transistor is forward biased by the constant voltage supply.

7. The apparatus according to claim 1, wherein the non-linear correcting unit further comprises at least one output amplifying circuit to amplify the corrected output analog signal.

8. The apparatus according to claim 1, wherein the non-linear correcting unit further comprises a capacitor to filter a DC component off the corrected output analog signal.

9. The apparatus according to claim 1, wherein the input unit comprises an amplifying unit comprising at least one stage of amplifying circuit to amplify the input voltage signal.

10. The apparatus according to claim 9, wherein the at least one stage of amplifying circuit comprises at least one power amplifier.

11. The apparatus according to claim 9, wherein the last stage of the at least one stage of amplifying circuit comprises a transistor.

12. The apparatus according to claim 1, wherein the compensating device comprises at least one diode or at least one transistor, a forward input of the diode or a junction of the transistor being connected to an inverting input of the compensating power amplifier, with an inverse input of the diode or the junction of the transistor being connected to the constant current source and an analog signal source, and a reference voltage being connected a non-inverting input of the compensating power amplifier.

13. The apparatus according to claim 1, wherein the temperature drift compensating unit further comprises a first capacitor connected to an output of the compensating power amplifier so as to filter a DC component off the input voltage signal.

14. An analog signal multiplexer, comprising a multiplexing switch and a plurality of the apparatus for transmitting an analog signal according to claim 1, with each switch channel of the multiplexer controlling one of the apparatus.

15. The analog signal multiplexer according to claim 14, wherein at least one switch channel comprises a second capacitor downstream of the multiplexing switch and configured to isolate disturbing currents originated from the other switch channels of the multiplexing switch.

16. The analog signal multiplexer according to claim 15, wherein the second capacitor is also used as the first capacitor.

17. The analog signal multiplexer according to claim 14, wherein the plurality of the apparatus for transmitting an analog signal share a common temperature drift compensating unit arranged upstream of the multiplexing switch.

18. A method for transmitting an analog signal, comprising:
transforming, with a photocoupler, an input analog signal into an output analog signal, which varies with the input analog signal in a manner of non-linearity;
correcting the non-linearity with a non-linearity correcting unit is arranged on an output side of the photocoupler;
compensating a temperature drift caused by the non-linearity correcting unit, with a temperature drift compensating unit arranged on an input side of the photocoupler; and
wherein the temperature drift compensating unit comprises a compensating device comprising at least one compensating diode or at least one compensating transistor, the compensating diode or a junction of the compensating transistor being forward biased to introduce into the input analog signal a compensating temperature drift that corresponds to the temperature drift caused by the non-linearity correcting unit.

19. The method according to claim 18, wherein the photocoupler is configured to work at least in a linear area of a characteristic curve in log-log coordinates of its current transfer ratio and the non-linearity correcting unit comprises a correcting device with linear property in at least part of its characteristic curve in log-log coordinates.

20. The method according to claim 19, wherein the correcting device comprises at least one correcting diode or at least one correcting transistor, which is forward biased by a constant voltage supply.

21. An apparatus for transmitting an analog signal, comprising:
an input unit comprising at least one stage of input amplifier circuit to transform an input voltage signal into a current signal as an input analog signal;
a photocoupler configured to transform the input analog signal into an output analog signal, which varies with the input analog signal in a manner of non-linearity;
a non-linearity correcting device configured to compensate the non-linearity and generate a corrected output analog signal; and
at least one output power amplifier circuit to amplify the corrected output analog signal;
wherein the input unit further comprises a temperature drift compensating device, a constant current source and a temperature drift compensating power amplifier to introduce into the input voltage signal a compensating temperature drift that corresponds to the temperature drift caused by the non-linearity correcting device.

22. The apparatus according to claim 21, wherein the photocoupler is configured to work at least in a linear area in a log-log coordinates of its current transfer ratio and the non-linearity correcting device comprises at least one diode or at least one transistor with linear property in at least part of its characteristic curve in log-log coordinates, the non-linearity correcting device is in series with the output side of the photocoupler, and the assembly comprising the non-linearity correcting device and the photocoupler is connected to a constant voltage supply, with a voltage across the output side of the photocoupler or a voltage across the non-linearity correcting device taken out as a corrected output analog signal.

23. The apparatus according to claim 21, wherein the temperature drift compensating device comprises at least one diode or at least one transistor, and wherein a forward input of the temperature drift compensating device is connected to an inverting input of the temperature drift compensating power amplifier, with an inverse input of the temperature drift compensating device being connected to the constant current source and an analog signal source, and a reference voltage being connected a non-inverting input of the temperature drift compensating power amplifier.

* * * * *